United States Patent
Lee et al.

(10) Patent No.: US 7,494,871 B2
(45) Date of Patent: Feb. 24, 2009

(54) SEMICONDUCTOR MEMORY DEVICES AND METHODS FOR FORMING THE SAME

(75) Inventors: Chang-Sub Lee, Gyeonggi-do (KR);
Jeong-Hyuk Choi, Gyeonggi-do (KR);
Woon-Kyung Lee, Gyeonggi-do (KR);
Jai-Hyuk Song, Seoul (KR);
Dong-Yean Oh, Seoul (KR)

(73) Assignee: Samsung Electronics Co., Ltd. (KR)

( * ) Notice: Subject to any disclaimer, the term of this patent is extended or adjusted under 35 U.S.C. 154(b) by 144 days.

(21) Appl. No.: 11/647,671

(22) Filed: Dec. 29, 2006

(65) Prior Publication Data
US 2008/0081413 A1 Apr. 3, 2008

(30) Foreign Application Priority Data
Oct. 2, 2006 (KR) .................. 10-2006-0097321

(51) Int. Cl.
*H01L 21/336* (2006.01)
(52) U.S. Cl. .................. 438/257; 438/238; 438/241; 438/244; 438/254; 438/258; 438/259; 438/299; 257/E21.682
(58) Field of Classification Search .................. None
See application file for complete search history.

(56) References Cited

U.S. PATENT DOCUMENTS

| 6,873,007 | B2 * | 3/2005 | Sugita et al. | 257/321 |
| 2004/0212023 | A1 * | 10/2004 | Umezawa et al. | 257/390 |

FOREIGN PATENT DOCUMENTS

| JP | 63000141 A | 1/1988 |
| JP | 2003-318289 A | 11/2003 |
| JP | 2003332467 A | 11/2003 |
| JP | 2004-111478 A | 4/2004 |
| JP | 2004-119457 A | 4/2004 |
| JP | 2004-228396 A | 8/2004 |
| KR | 1020030057851 A | 7/2003 |

* cited by examiner

*Primary Examiner*—N Drew Richards
*Assistant Examiner*—Kyoung Lee
(74) *Attorney, Agent, or Firm*—Myers Bigel Sibley & Sajovec, P.A.

(57) ABSTRACT

A semiconductor memory device can include select transistors and cell transistors on a semiconductor substrate. An insulation layer covers the select transistors and the cell transistors. The bit lines are in the insulation layer and are electrically connected to respective ones of the select transistors. The bit lines are arranged along at least two different parallel planes having different heights relative to the semiconductor substrate.

14 Claims, 22 Drawing Sheets

SEMICONDUCTOR MEMORY DEVICES AND METHODS FOR FORMING THE SAME

CROSS-REFERENCE TO RELATED APPLICATIONS

This U.S. non-provisional patent application claims priority under 35 U.S.C. § 119 of Korean Patent Application No. 2006-97321, filed on Oct. 2, 2006, the entire contents of which are hereby incorporated by reference.

FIELD OF THE INVENTION

The present invention disclosed herein relates to semiconductor devices and related methods of forming semiconductor memory devices.

BACKGROUND OF THE INVENTION

Two types of semiconductor memory devices are volatile memory devices which lose their stored data content in the absence of power, and non-volatile memory devices which retain their stored data content in the absence of power.

A flash memory device, which is a type of non-volatile memory device, can be configured as a NOR type memory device and/or as a NAND type memory device. NOR type memory devices can have a relatively fast operational speed because they control each memory cell. However, because every two cells requires one contact, the NOR type memory device can have a relatively large size cell area. In contrast, a NAND type memory device controls a plurality of memory cells in one body by binding the memory cells with one string and, accordingly, can be configured for a high degree of integration.

The NAND type flash memory device includes a memory block and a page buffer block. The memory block includes a plurality of strings connected in parallel. Each string includes a plurality of cell transistors connected in serial, a string select transistor, and a ground select transistor, which are respectively disposed on both sides of the string. The page buffer block includes a plurality of page buffers. The page buffers transmit programming data and reading data between the memory block and a peripheral circuit. Bit lines are disposed to electrically connect page buffers to string select transistors for data transmission. The bit lines are divided into even bit lines and odd bit lines.

In a conventional NAND type flash memory device, bit lines in a memory block are arranged in an even/odd/even/odd bit line order. Accordingly, when a memory cell (hereinafter, referred to as an even cell) connected to an even bit line is programmed after programming a memory cell (hereinafter, referred to as an even cell) connected to an even bit line, the even cell has a relatively large influence from the odd cell. That is, since the odd cells are disposed on both ends of the even cells, coupling disturbance between adjacent cells can occur when a programming operation is performed, which may deteriorate the reliability and operational characteristics of the associated flash memory device.

SUMMARY OF THE INVENTION

Various embodiments of the present invention provide a semiconductor memory device that may exhibit improved reliability and operation characteristic.

In some embodiments of the present invention, a semiconductor memory device includes select transistors and cell transistors on a semiconductor substrate. An insulation layer covers the select transistors and the cell transistors. The bit lines are in the insulation layer and are electrically connected to respective ones of the select transistors. The bit lines are arranged along at least two different parallel planes having different heights relative to the semiconductor substrate.

In some further embodiments, the bit lines may include a pair of even bit lines on different ones of the at least two different parallel planes, and a pair of odd bit lines on different ones of the at least two different parallel planes. The pair of even bit lines and the pair of odd bit lines can repeat to form a pattern.

In some further embodiments, the insulation layer may include a first insulation layer covering the select transistors and the cell transistors, and a second insulation layer on the first insulation layer. Some of the bit lines are on the first insulation layer and other of the bit lines are on the second insulation layer.

In still some further embodiments, the select transistors include first select transistors and second select transistors. The bit lines may include first bit lines on the first insulation layer and electrically connected to the first select transistors, and second bit lines on the second insulation layer and electrically connected to the second select transistors.

In still some further embodiments, the select transistors may include a pair of first and second select transistors. The first and second select transistors can repeat to form a pattern. The select transistors may include a pair of first select transistors and a pair of second select transistors. The pair of first select transistors and the pair of second select transistors can repeat to form a pattern.

Some other embodiments of the present invention are directed to methods of forming a semiconductor memory device. Select transistors and cell transistors are formed on a semiconductor substrate. A plurality of bit lines are formed which are electrically connected to the select transistors and to the cell transistors. The bit lines are formed on a plurality of parallel planes having different heights relative to the semiconductor substrate.

In some further embodiments, the bit lines include a pair of even bit lines on different ones of the parallel planes having a different first and second height relative to the semiconductor substrate, and a pair of odd bit lines on different ones of the parallel planes having a different respective third and fourth heights relative to the semiconductor substrate. The pair of even bit lines and the pair of odd bit lines are repeated to form a pattern.

In some further embodiments, the select transistors may include first select transistors and second select transistors. Forming the bit lines may include: forming a first insulation layer covering the select transistors and the cell transistors; forming first bit lines on the first insulation layer at the first height relative to the semiconductor substrate, where the first bit lines are electrically connected to the first select transistors; forming a second insulation layer covering the first bit lines; and forming second bit lines on the second insulation layer at the second height relative to the semiconductor substrate, the second bit lines are electrically connected to the second select transistors.

In still some further embodiments, forming the first insulation layer may include forming a first contact plug that penetrates the first insulation layer and is electrically connected to the first select transistor. Forming the second insulation layer may include forming a second contact plug that penetrates the first insulation layer and the second insulation layer and is electrically connected to the second select transistor.

In still some further embodiments, forming the first insulation layer may include forming a first contact plug that penetrates the first insulation layer and is electrically connected to the first select transistor, and a second bottom contact plug that is electrically connected to the second select transistor. Forming the second insulation layer may include forming a second top contact plug that penetrates the second insulation layer and is electrically connected to the second bottom contact plug.

In yet some further embodiments, the select transistors may include a pair of first select transistors and a pair of second select transistors that repeat to form a pattern.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures:

FIGS. 4A through 13A are sectional views in a word line direction and illustrate methods for forming a semiconductor memory device according to some embodiments of the present invention;

FIGS. 4B through 13B are sectional views in a bit line direction and illustrate methods for forming a semiconductor memory device according to some embodiments of the present invention;

FIGS. 14A through 17A are sectional views in a word line direction and illustrate methods for forming a semiconductor memory device according to some other embodiments of the present invention; and FIGS. 14B through 17B are sectional views in a bit line direction and illustrate methods for forming a semiconductor memory device according to some other embodiments of the present invention.

DETAILED DESCRIPTION OF EMBODIMENTS OF THE INVENTION

Figure 1:
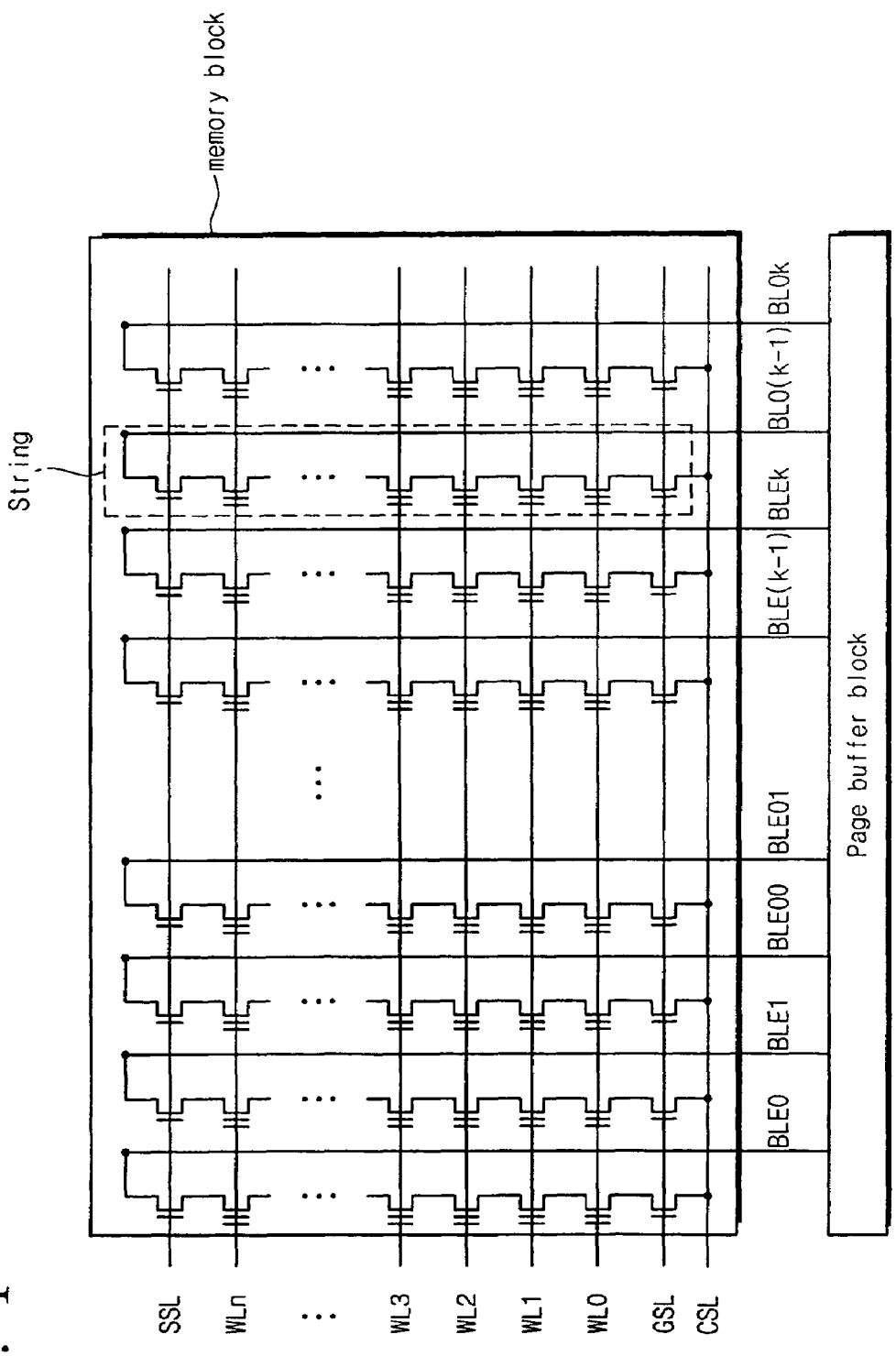
FIG. 1 is a layout of a semiconductor memory device according to some embodiments of the present invention.

Embodiments of the present invention will be described with reference to the accompanying drawings. The present invention may, however, be embodied in many different forms and should not be construed as limited to the embodiments set forth herein. Rather, the embodiments are provided so that disclosure of the present invention will be thorough and complete, and will fully convey the scope of the present invention to those skilled in the art. The principles and features of this invention may be employed in varied and numerous embodiments without departing from the scope of the present invention. In the drawings, the size and relative sizes of patterns, structures and contacts may be exaggerated for clarity. The drawings are not to scale. Like reference numerals designate like elements throughout the drawings.

It will also be understood that when an element or layer is referred to as being "on" and/or "connected to" another patterns, structures or contacts, the patterns, structures or contacts may be directly on and/or directly connected to the other patterns, structures or contacts may be present. As used herein, the term "and/or" includes any and all combinations of one or more of the associated listed items.

It will also be understood that, although the terms first, second, etc. may be used herein to describe various directions, sidewalls, distances, line widths and/or patterns. These directions, sidewalls, distances, line widths and/or patterns should not be limited by these terms. These terms may be used to distinguish one direction, sidewall, distance, line width and/or pattern from another direction, sidewall, distance, line width and/or pattern. For example, a first direction, sidewall, distance, line width and/or pattern discussed below could be termed a second direction, sidewall, distance, line width and/or pattern without departing from the teachings of the present invention.

Spatially relative terms, such as "lower," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures.

The terminology used herein is for the purpose of describing particular embodiments only and is not intended to limit of the invention. As used herein, the singular terms "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence and/or addition of one or more other features, integers, steps, operations, elements, components, and/or groups thereof.

Unless otherwise defined, all terms (including technical and scientific terms) used herein may have the same meaning as what is commonly understood by one of ordinary skill in the art. It will be further understood that terms, such as those defined in commonly used dictionaries, should be interpreted as having a meaning that is consistent with their meaning in the context of this specification and the relevant art and will not be interpreted in an idealized and/or overly formal sense unless expressly so defined herein.

In the description, the term "substrate" used herein may include a structure based on a semiconductor, having a semiconductor surface exposed. It should be understood that such a structure may contain silicon, silicon on insulator, silicon on sapphire, doped or undoped silicon, an epitaxial layer supported by a semiconductor substrate, or another structure of a semiconductor. And, the semiconductor is not limited to silicon and may be silicon-germanium, germanium, germanium arsenide, and/or any other semiconductor material. In addition, the substrate described hereinafter may be one in which regions, conductive layers, insulation layers, their patterns, and/or junctions are formed.

Exemplary Structure of Semiconductor Memory Device:

FIG. 1 is a layout of a semiconductor memory device according to some embodiments of the present invention.

Referring to FIG. 1, a NAND type flash memory device includes a memory block and a page buffer block. The memory block includes a plurality of strings connected in parallel. Each string includes a plurality of cell transistors connected in serial, a string select transistor, and a ground select transistor. The string select transistor and the ground select transistor are respectively disposed on opposite sides of the string. The string select transistor and the ground select transistor respectively include control gates receiving a string select signal and a ground select signal. The select signals are used for programming and reading of the cell transistors. The control gates of the string select transistors in each of the strings are connected to each other to form a string select line (SSL), and the control gates of the ground select transistors are connected to each other to form a ground select line (GSL). Additionally, the control gates of the cell transistors in each of the strings are connected to each other to form a plurality of word lines (WLn). A common source line (CSL) is disposed on one end of each of the strings to provide a source voltage into the string.

The page buffer block includes a plurality of page buffers (not shown). The page buffers transmit programming data and reading data between the memory block and a peripheral circuit (not shown). Bit lines are disposed to electrically connect the page buffers and the string select transistors for data transmission. The bit lines can be divided into even bit lines (BLEk) and odd bit lines (BLOk). A pair of the even bit line and the odd bit line is connected to each of page buffers.

In some embodiments of the present invention, the bit lines include a pair of even bit lines disposed on respectively different heights relative to a semiconductor substrate, and a pair of odd bit lines disposed on respectively different heights relative to the semiconductor substrate, which alternately occur in a repeating pattern. Further description of the structure will now be made with reference to various sectional views. A pair of even bit lines disposed on respectively different heights relative to one or the other pair of bit lines (or, a pair of odd bit lines disposed on respectively different heights) is referred to as a first bit line and a second bit line, respectively, for convenience.

Figure 2A:
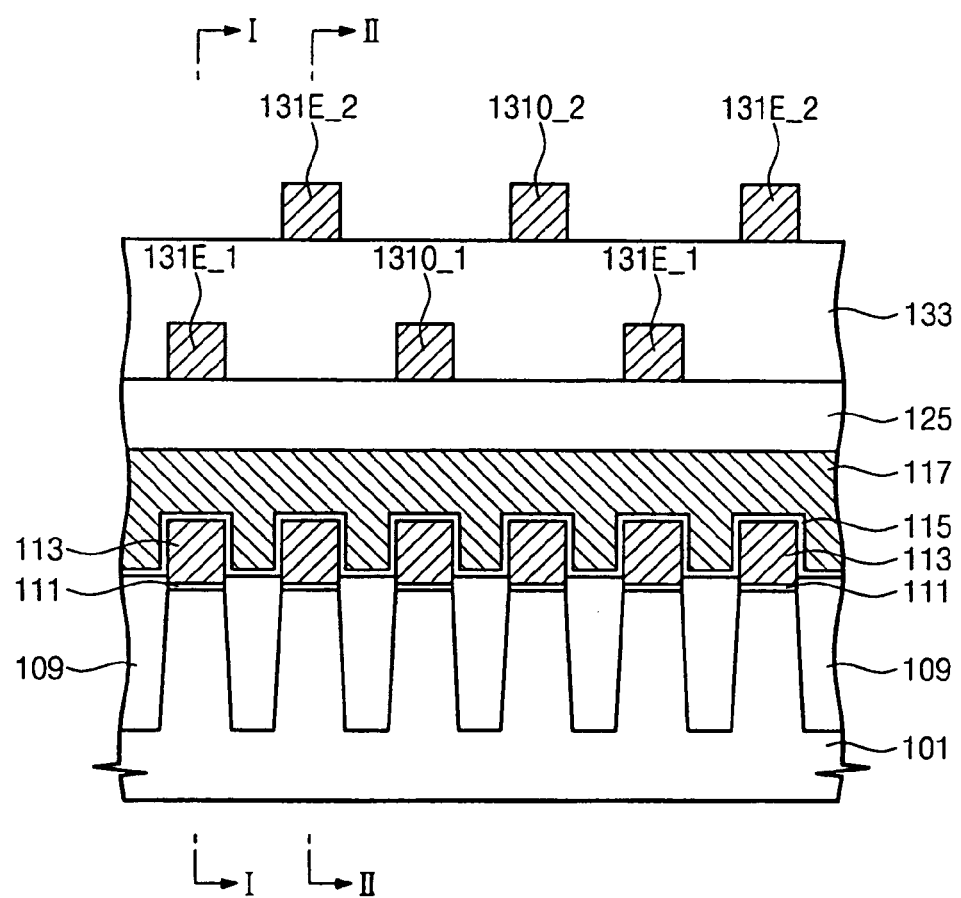
FIG. 2A is a sectional view of a semiconductor memory device in a word line direction according to some embodiments of the present invention.
Figure 2B:
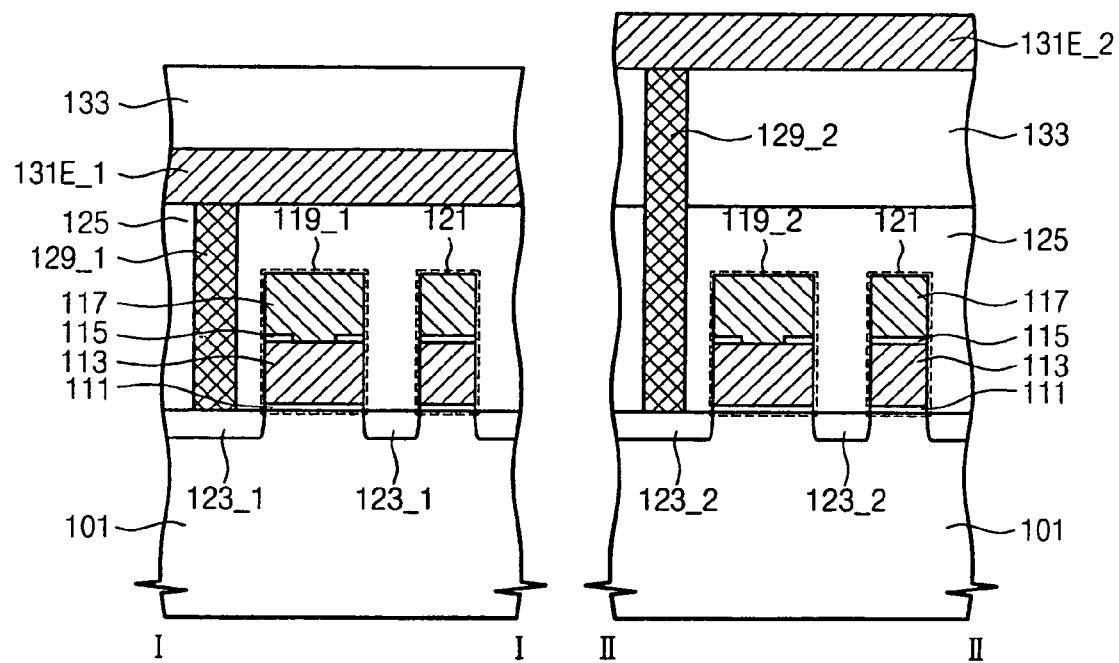
FIG. 2B is a sectional view of a semiconductor memory device in a bit line direction according to some embodiments of the present invention.

FIG. 2A is a sectional view of a semiconductor memory device in a word line direction according to some embodiments of the present invention. FIG. 2B is a sectional view of a semiconductor memory device in a bit line direction according to some embodiments of the present invention. A sectional view of a first bit line is in the left side of FIG. 2B, and a sectional view of a second bit line is in the right side of FIG. 2B.

Referring to FIGS. 2A and 2B, an active region is defined in a semiconductor substrate 101 by a device isolation layer 109. First and second string select gate structures 119_1 and 119_2 and cell gate structures 121 are disposed on the active region. The first and second string select gate structures 119_1 and 119_2 and cell gate structures 121 include a gate insulation layer 111, a floating gate pattern 113, an inter-gate insulation layer 115, and a control gate pattern 117. However, the control gate pattern 117 is electrically connected to the floating gate pattern 113 by a butting contact or by the intergate insulation layer 115 being removed in the first and second string select gate structures 119_1 and 119_2. Impurity regions 123_1 and 123_2 are disposed on opposite ends of the first and second string select gate structures 119_1 and 119_2 and the cell gate structures 121. The first and second string select gate structures 119_1 and 119_2 and impurity regions 123_1 and 123_2 on opposite sides thereof include first and second string select transistors. Additionally, the cell gate structures 121 and the impurity regions 123_1 and 123_2 on opposite sides thereof include cell transistors.

A first insulation layer 125 covers the string select transistors and the cell transistors. A second insulation layer 133 is disposed on the first insulation layer 125. A first even bit line 131E_1 and a first odd bit line 131O_1 are disposed on the first insulation layer 125, and a second even bit line 131E_2 and a second odd bit line 131O_2 are disposed on the second insulation layer 133. The bit lines include a pair of even bit lines 131E_1 and 131E_2 disposed on respectively different heights relative to the semiconductor substrate 101, and a pair of odd bit lines 131O_1 and 131O_2 disposed on respectively different heights relative to the semiconductor substrate 101, and may alternate in location between the different heights with repetition. For example, as shown in FIG. 2A, the even bit lines are alternately disposed along a first row in the second row, where one row is higher than the other row. An interval between the adjacent first even bit line 131E_1 and first odd bit line 131O_1 can be a half of an interval between the adjacent first even bit lines 131E_1 or the adjacent first odd bit lines 131O_1. An interval between the adjacent second even bit line 131E_2 and second odd bit line 131O_2 can be a half of an interval between the adjacent second even bit lines 131E_2 or the adjacent second odd bit lines 131O_2. Accordingly, the first even bit lines 131E_1 and the first odd bit lines 131O_1 repeat in an alternating order with a same interval therebetween. The second even bit lines 131E_2 and the second odd bit lines 131O_2 similarly repeat in an alternating order with a same interval therebetween, but are located along a row that is higher than the row formed by the repeating first even bit lines 131E_1 and the first odd bit lines 131O_1.

The first even bit line 131E_1 is electrically connected to the impurity region 123_1 of a first string select transistor by a first contact plug 129_1, and the second even bit line 131E_2 is electrically connected to the impurity region 123_2 of a second string select transistor by a second contact plug 129_2. Although not illustrated, the first and second odd bit lines 131O_1 and 131O_2 are connected to the respective first and second string select transistors like the structure of the first and second even bit lines 131E_1 and 131E_2. The select transistors include a pair of first and second select transistors, which are repeatedly occurring.

Because the bit lines in a memory block are disposed in an even/even/odd/odd bit line order, the coupling disturbance may be reduced between adjacent cells when performing a programming operation. That is, when programming a memory cell (an odd cell) connected to an odd bit line after programming a memory cell (an even cell) connected to an even bit line, because an odd cell is disposed on one side of an even cell, the even cell is less influenced by the odd cell compared to a conventional memory device in which odd cells are disposed on both opposite sides of an even cell. Additionally, since a pair of even bit lines (or a pair of odd bit lines) is disposed on respectively different heights, coupling disturbance can be reduced between even bit lines (or, odd bit lines) when performing a reading operation. Therefore, reliability and operational characteristics may be improved in an associated semiconductor memory device.

Figure 3:
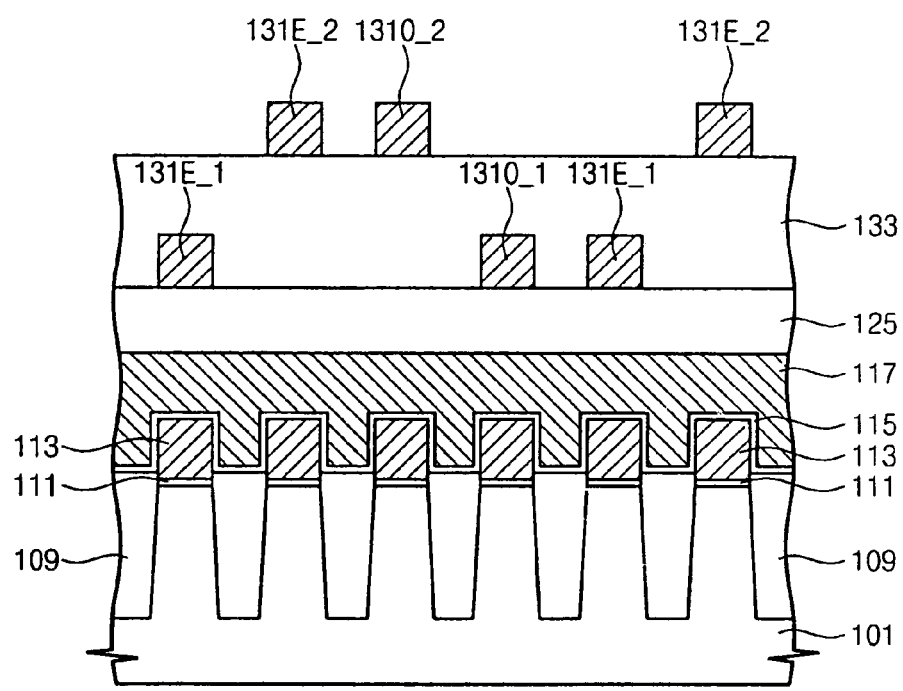
FIG. 3 is a sectional view of a semiconductor memory device in a word line direction according to some other embodiments of the present invention.

FIG. 3 is a sectional view of a semiconductor memory device in a word line direction according to some other embodiments of the present invention. For sake of brevity, the structure of FIG. 3 that has already been described with regard to FIG. 2 is not repeated here.

Referring to FIG. 3, a pair of first even bit lines 131E_1 and 131E_2, and a pair of odd bit lines 131O_1 and 131O_2 repetitively occur in a symmetric manner. An interval of the first even bit line 131E_1 and the first odd bit line 131O_1 on one side thereof is different from an interval between the first even bit line 131E_1 and the first odd bit line 131O_1 on the other side thereof. The bit lines include a pair of adjacent first even and odd bit lines 131E_1 and 131O_1, and a pair of adjacent second even and odd bit lines 131E_2 and 131O_2, which repeatedly occur. The first even bit line 131E_1 and the first odd bit line 131O_1 are disposed on a first insulation layer 125, and the second even bit line 131E_2 and the second odd bit line 131O_2 are disposed on a second insulation layer 133. The select transistors include a pair of first select transistors and a pair of second select transistors, which disposed occur.

As described above, because the bit lines in a memory block are disposed in an even/even/odd/odd bit line order, any coupling disturbance may be reduced between adjacent cells when performing a programming operation. Moreover, because a pair of even bit lines (or a pair of odd bit lines) is disposed on respectively different heights, coupling disturbance may be reduced between even bit lines (or, odd bit lines) when performing a reading operation.

Methods For Forming Semiconductor Memory Device:

FIGS. 4A through 13B are sectional views illustrating methods for forming a semiconductor memory device according to some embodiments of the present invention. FIGS. 4A through 13A are sectional views in a word line direction to illustrate methods for forming a semiconductor memory device according to some embodiments of the present invention. FIGS. 4B through 13B are sectional views in a bit line direction to illustrate methods for forming a semiconductor memory device according to some embodiments of the present invention. Sectional views of the first bit lines are illustrated on the left side of FIGS. 4B through 13B. Sectional views of the second bit lines are illustrated on the right side of FIGS. 4B through 13B.

Figure 4A:
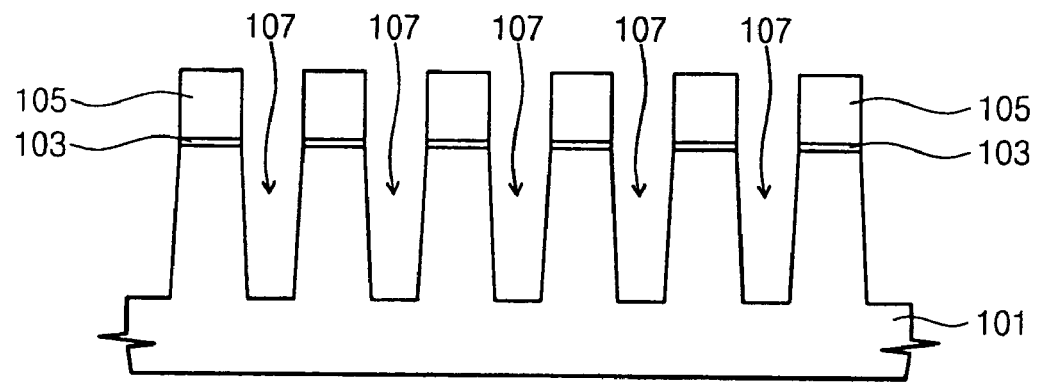
Figure 4B:
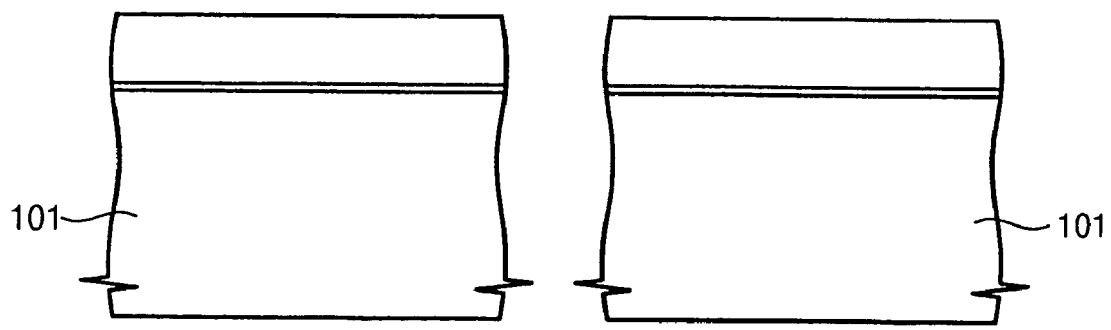

Referring to FIGS. 4A and 4B, a pad oxide layer pattern 103 and a trench mask pattern 105 are formed on a semiconductor substrate 101. The trench mask pattern 105 may include a poly silicon pattern and a nitride layer pattern. The pad oxide layer pattern 103 alleviates stress that occurs between the semiconductor substrate 101 and the trench mask pattern 105. The trench mask pattern 105 is used as an etching mask to etch a portion of the semiconductor substrate 101, thereby forming a trench 107. The semiconductor substrate 101 between the trenches 107 is defined as an active region.

Figure 5A:
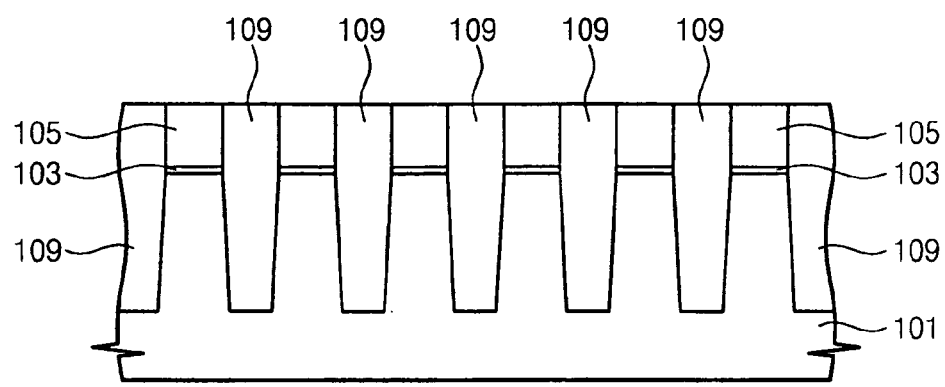
Figure 5B:
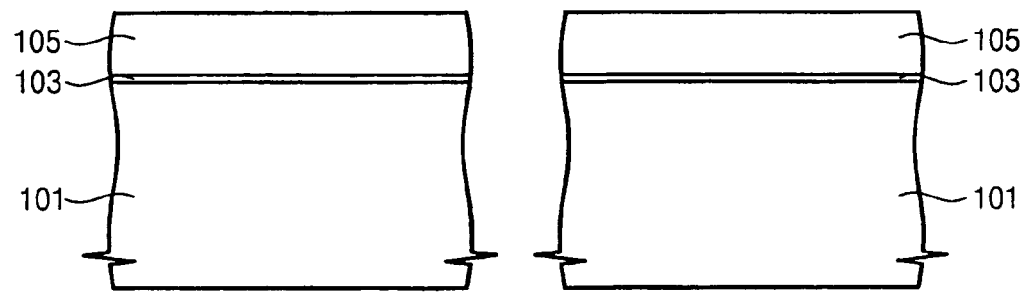

Referring to FIGS. 5A and 5B, a planarization process is performed to expose the top of the trench mask pattern 105 after filling the trench 107 with an insulation layer, thereby forming a device isolation layer 109.

Figure 6A:
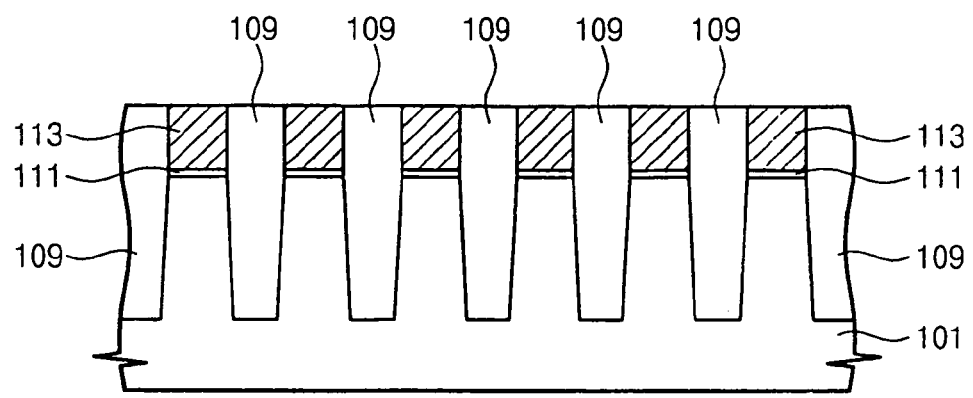
Figure 6B:
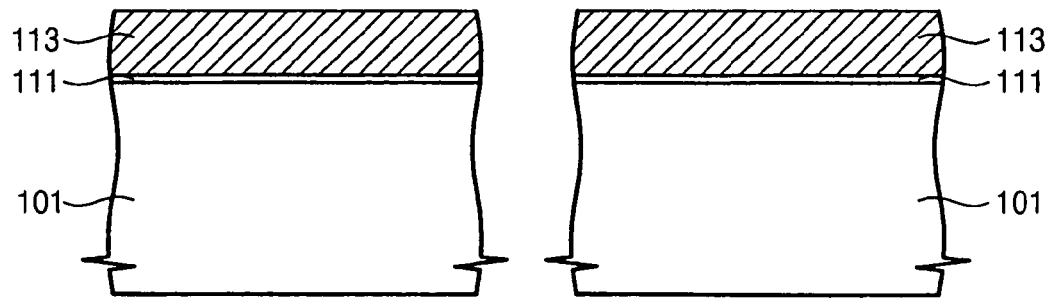

Referring to FIGS. 6A and 6B, after removing the pad oxide layer pattern 103 and the trench mask pattern 105, a gate insulation layer 111 and a floating gate pattern 113 are formed on the active region. For example, the gate insulation layer 111 can be formed by performing a thermal oxide process. Moreover, the floating gate pattern 113 can be formed by performing a planarization process exposing the top of the device isolation layer 109 after performing a chemical vapor deposition (CVD) process on a doped poly silicon layer.

Figure 7A:
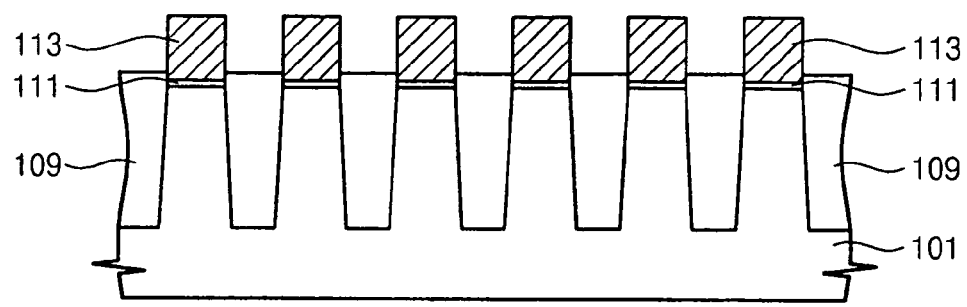
Figure 7B:
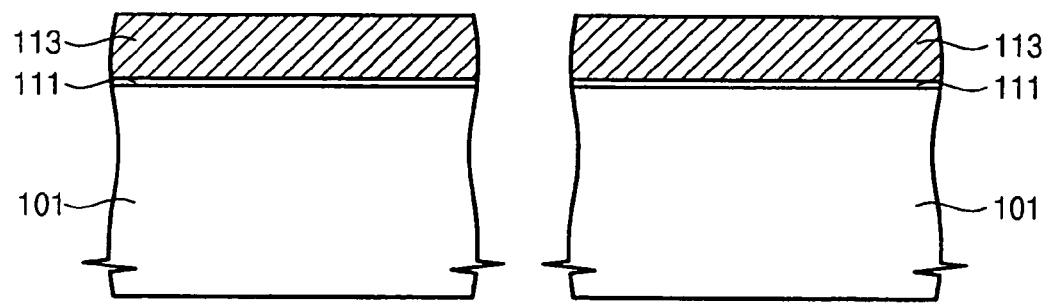

Referring to FIGS. 7A and 7B, the top of the device isolation layer 109 is recessed and both side walls of the floating gate pattern 113 are exposed by performing an etching process.

Figure 8A:
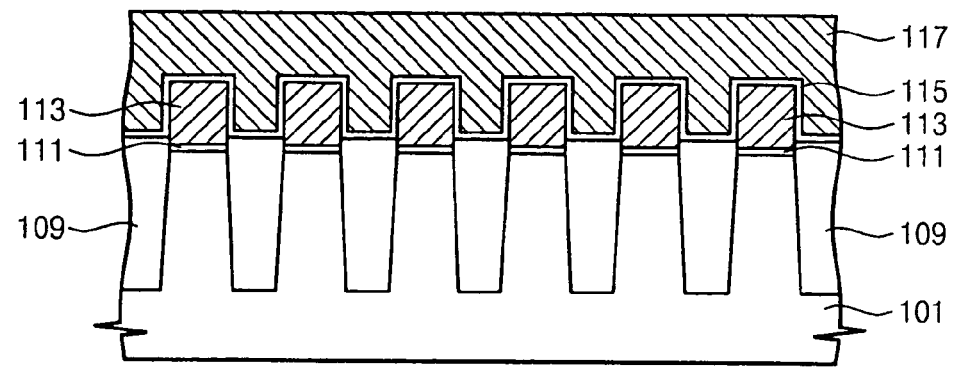
Figure 8B:
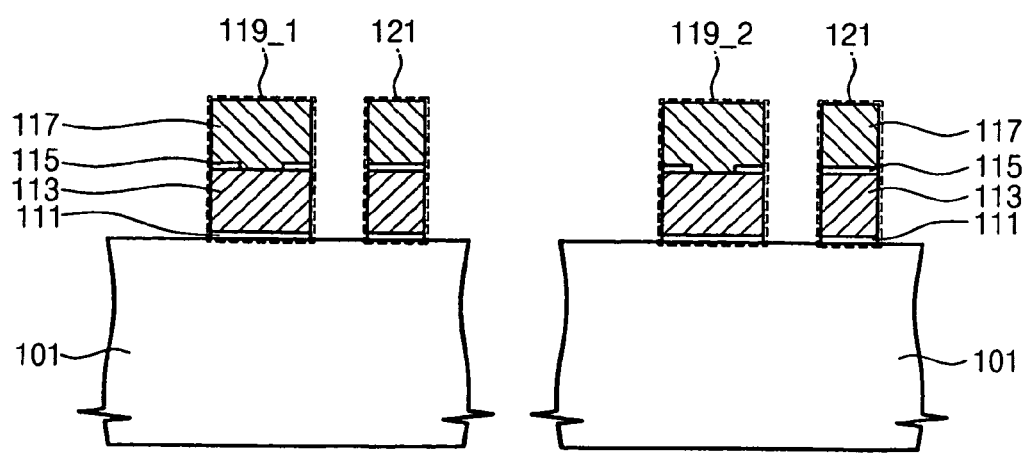

Referring to FIGS. 8A and 8B, an inter-gate insulation layer 115 and a control gate layer 117 are formed on the semiconductor substrate 101. For example, the inter-gate insulation layer 115 is formed of an oxide/nitride/oxide layer (an ONO layer). The control gate layer 117 may be formed to include doped polysilicon layer, metal layer, and/or silicide layer Next, the gate insulation layer 111, the floating gate pattern 113, the inter-gate insulation layer 115, and the control gate layer 117 are patterned to form first and second string select gate structures 119_1 and 119_2, and a cell gate structures 121.

However, a portion or all of the inter-gate insulation layer in the select gate structures is removed before forming the control gate layer 117. Therefore, the control gate pattern 117 is electrically connected to the floating gate pattern 113.

Figure 9A:
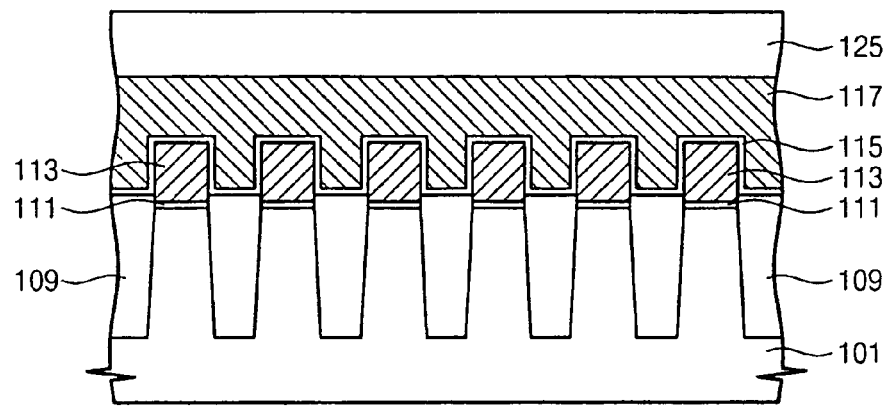
Figure 9B:
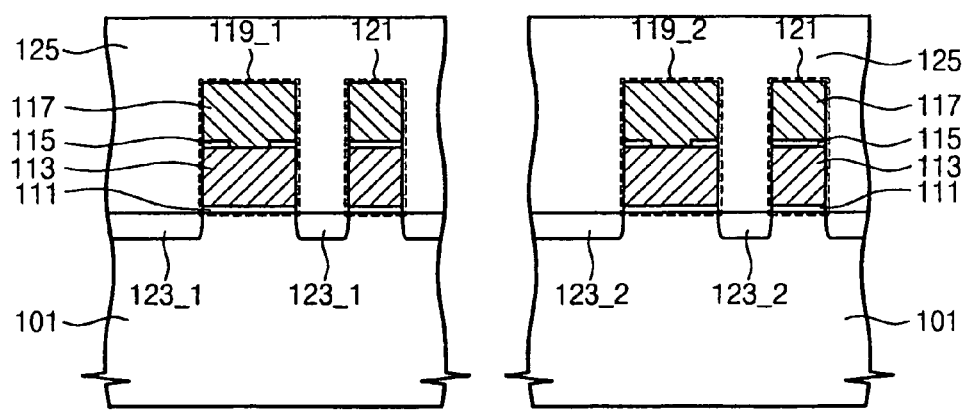

Referring to FIGS. 9A and 9B, an ion implantation process is performed to form first and second impurity regions 123_1 and 123_2 on a semiconductor substrate 101 in both sides of the string select gate structures 119_1 and 119_2, and the cell gate structures 121. Accordingly, a first string select transistor and a second string select transistor are formed. The first string select transistor includes a first string select gate structure 119_1 and first impurity regions 123_1. The second string select transistor includes a second string select gate structure 119_2 and second impurity regions 123_2. Additionally, cell transistors are formed to include cell gate structures 121 and the first and second impurity regions 123_1 and 123_2. Next, a first insulation layer 125 is formed to cover the first and second string select transistors and the cell transistors.

Figure 10A:
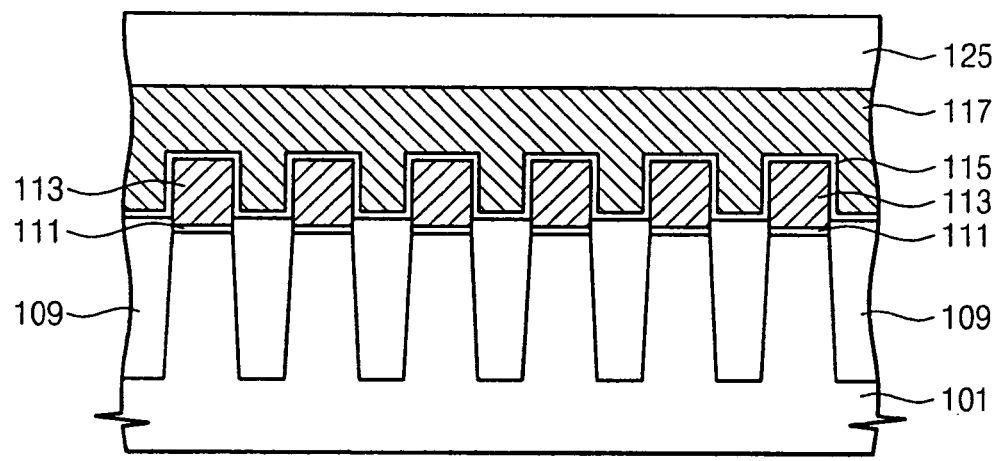
Figure 10B:
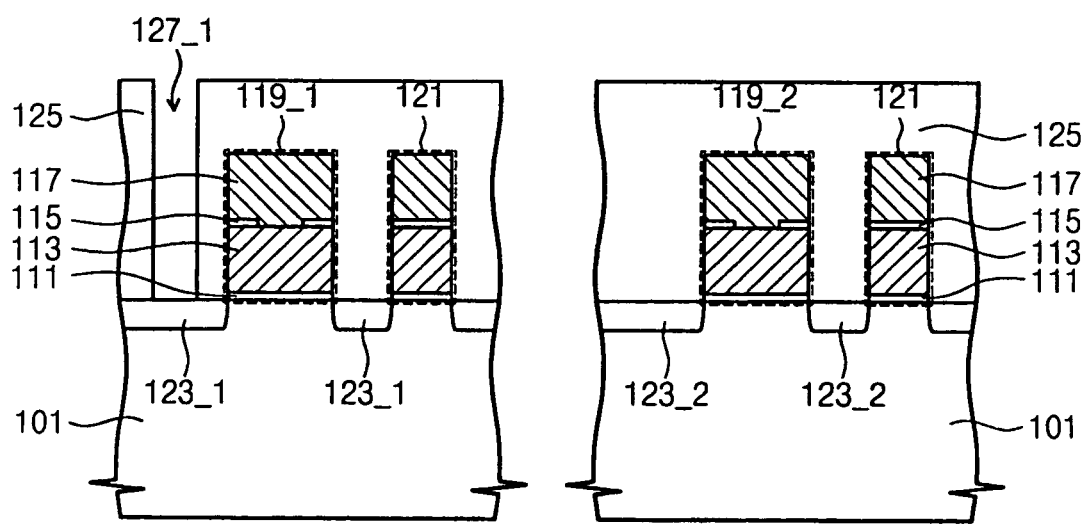

Referring to FIGS. 10A and 10B, a first contact hole 127_1 is formed to expose the first impurity region 123_1 of the first string select transistor by patterning the first insulation layer 125.

Figure 11A:
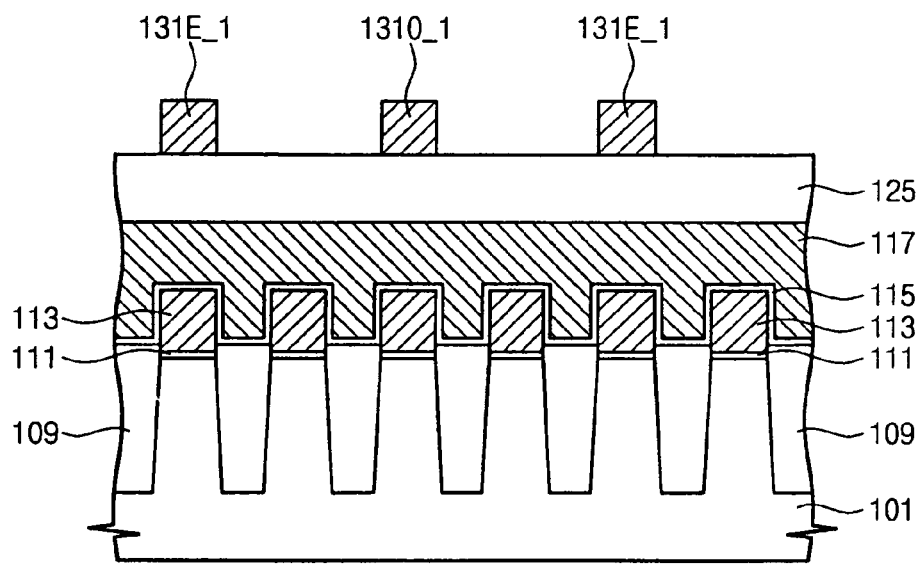
Figure 11B:
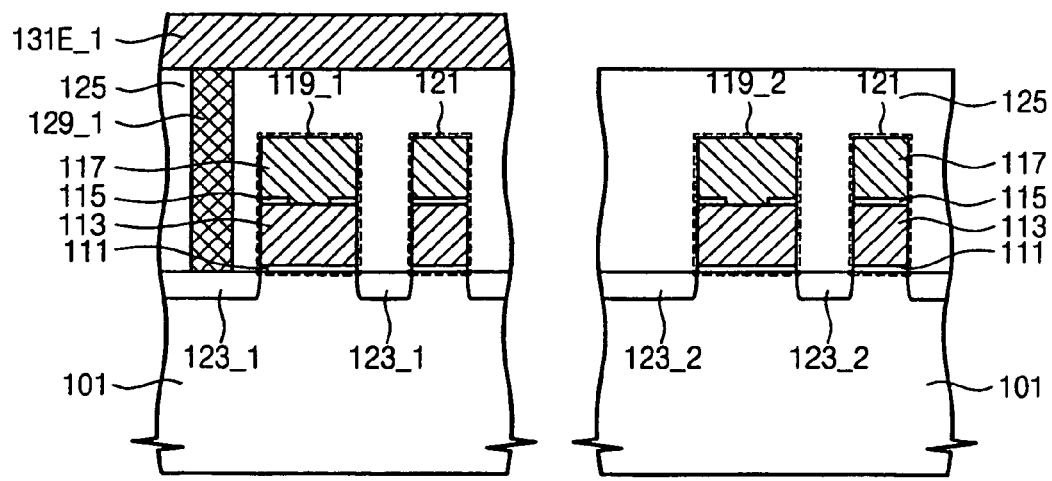

Referring to FIGS. 11A and 11B, a first contact plug 129_1 is formed in the first contact hole 127_1. The contact plug 129_1 may be formed by performing a planarization process after filling the first contact hole 127_1 with a metal material such as a doped polysilicon and/or tungsten. Next, a metal layer is formed on the first insulation layer 125, and then patterned to form first even and odd bit lines 131E_1 and 131O_1 that are electrically connected to the first contact plug 129_1. Moreover, the first even and odd bit lines 131E_1 and 131O_1 are electrically connected to the first string select transistor through the first contact plug 129_1. An interval between the adjacent first even bit line 131E_1 and first odd bit line 131O_1 can be half of an interval between the adjacent first even bit lines 131E_1 or the adjacent first odd bit lines 131O_1. That is, the first even bit line 131E_1 and the first odd bit line 131O_1 alternately occur relative to one another and with a same interval therebetween.

Figure 12A:
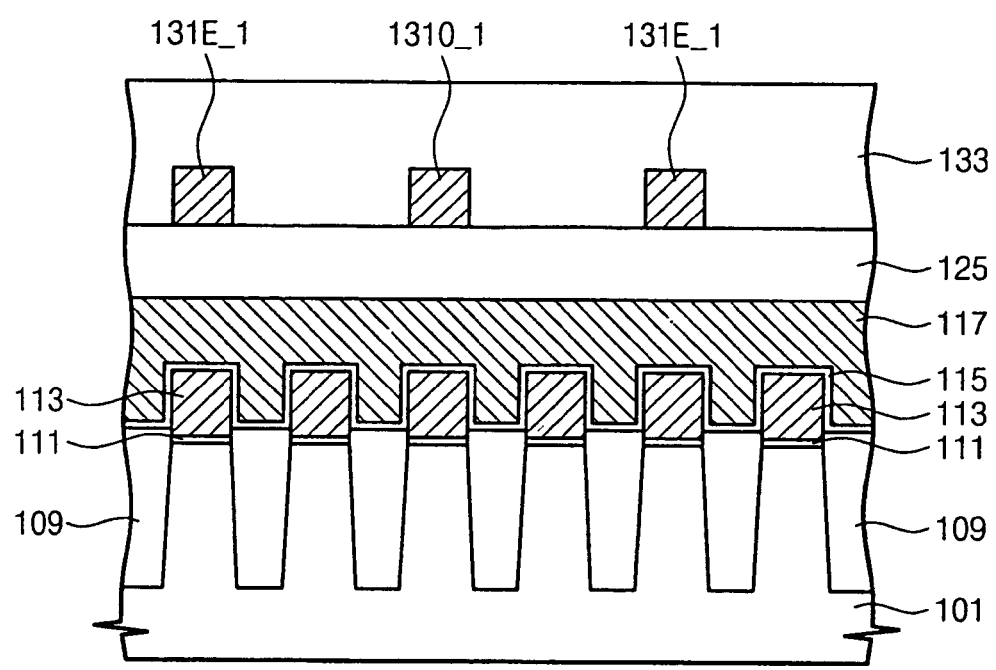
Figure 12B:
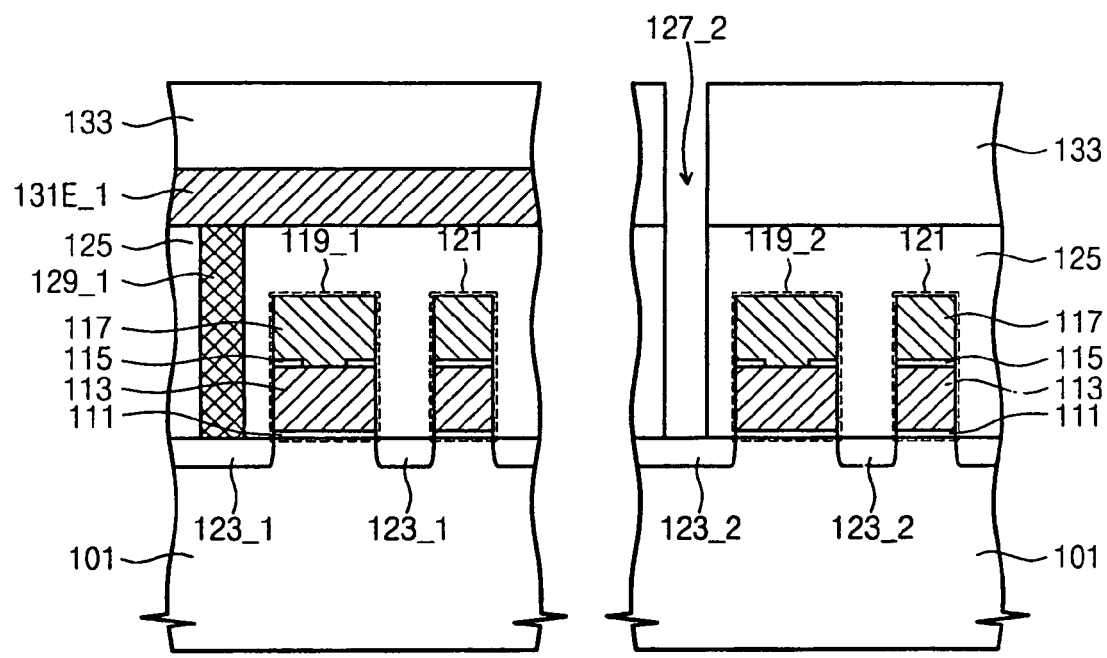

Referring to FIGS. 12A and 12B, a second insulation layer 133 is formed on the first insulation layer 125 to cover the first even and odd bit lines 131E_1 and 131O_1. The second insulation layer 133 and the first insulation layer 125 are sequentially patterned to form a second contact hole 127_2 exposing the second impurity region 123_2 of the second select transistor.

Figure 13A:
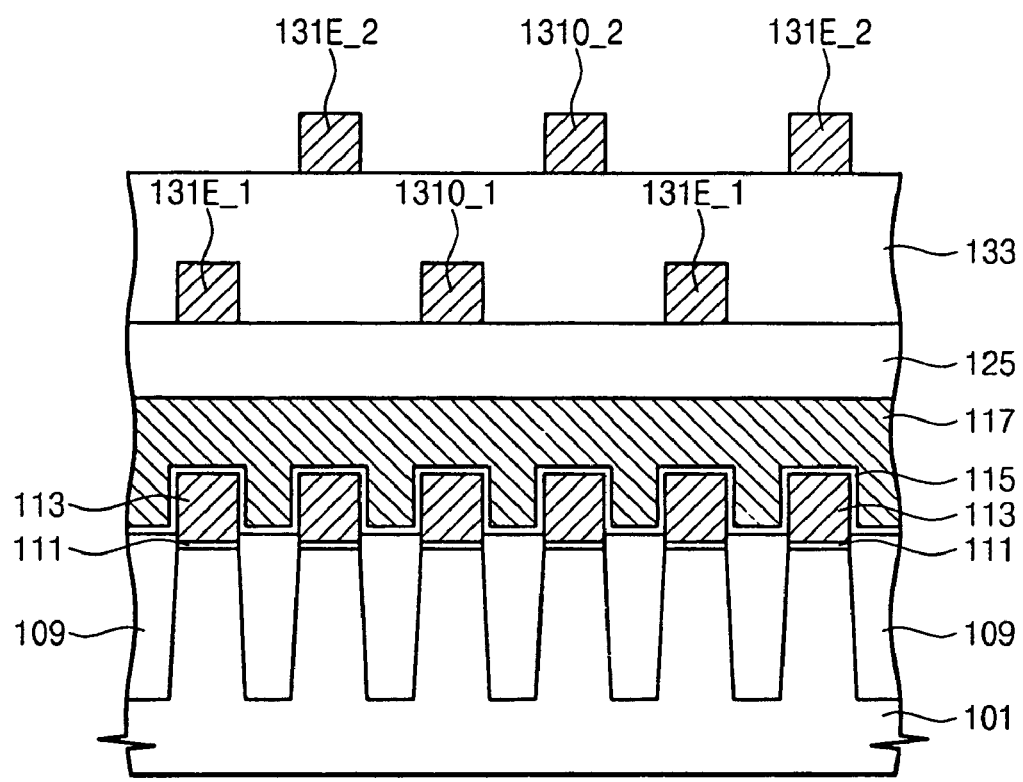
Figure 13B:
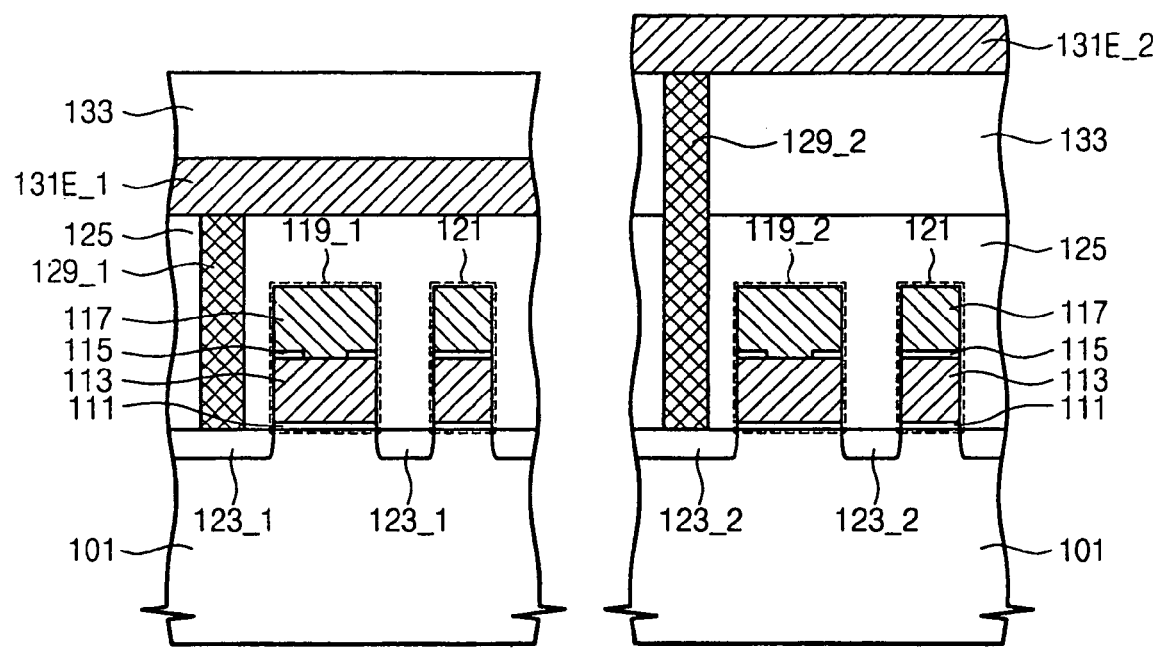

Referring to FIGS. 13A and 13B, a second contact plug 129_2 is formed in the second contact hole 127_2. The second contact plug 129_2 may be formed by performing a planarization process after filling the second contact hole 127_2 with a metal material such as a doped poly silicon and/or tungsten. Next, a metal layer is formed on the second insulation layer 133, and then patterned to form second even and odd bit lines 131E_2 and 131O_2 that are electrically connected to the second contact plug 129_2. Additionally, the second even and odd bit lines 131E_2 and 131O_2 are electrically connected to the second string select transistor through the second contact plug 129_2. An interval between the adjacent second even bit line 131E_2 and second odd bit line 131O_2 can be half of an interval between the adjacent second even bit lines 131E_2 or the adjacent second odd bit lines 131O_2. That is, the second even bit line 131E_2 and the second odd bit line 131O_2 alternately occur relative to one another and with the same interval therebetween.

The bit lines include a pair of even bit lines 131E_1 and 131E_2 having respectively different first and second heights, and a pair of odd bit lines 131O_1 and 131O_2 having the respectively different first and second heights, which alternately occur in the same interval therebetween. That is, the second bit lines 131E_2 and 131O_2 having the second height is formed higher than the first bit lines 131E_1 and 131O_1 having the first height by the thickness of the second insulation layer 133.

FIGS. 14A through 17B are sectional views illustrating methods for forming a modified semiconductor memory device according to some other embodiments of the present invention. FIGS. 14A through 17A are sectional views in a word line direction to illustrate methods for forming a semiconductor memory device according to some other embodiments of the present invention. FIGS. 14B through 17B are sectional views in a bit line direction to illustrate methods for forming a semiconductor memory device according to some other embodiments of the present invention. For the sake of brevity, the same structure and methods that have been described above are not repeated here. The description of the structure and methods provided with regard to FIGS. 4A through 9B may be applied to the following embodiments shown in FIGS. 14A through 17B.

Figure 14A:
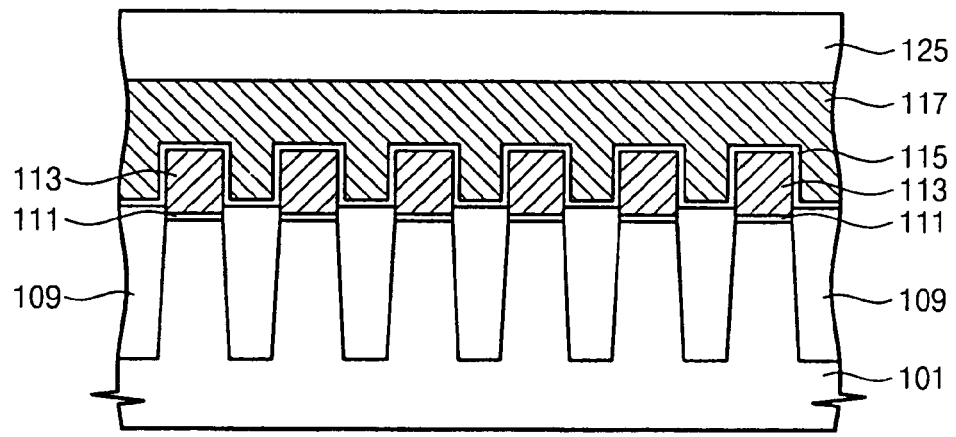
Figure 14B:
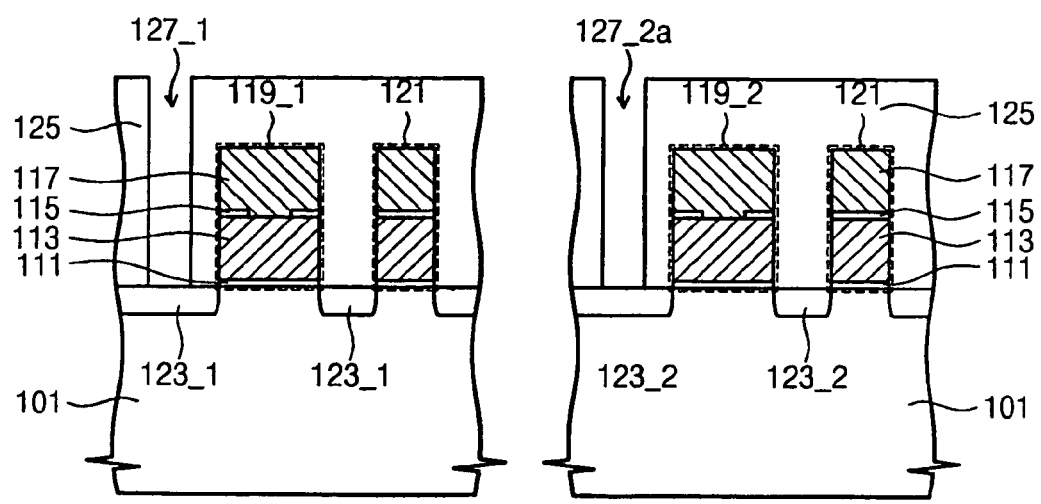

Referring to FIGS. 14A and 14B, the first insulation layer 125 is patterned to form a first contact hole 127_1 exposing the first impurity region 123_1 of the first string select transistor, and a second bottom contact hole 127_2a exposing the second impurity region 123_2 of the second string select transistor.

Figure 15A:
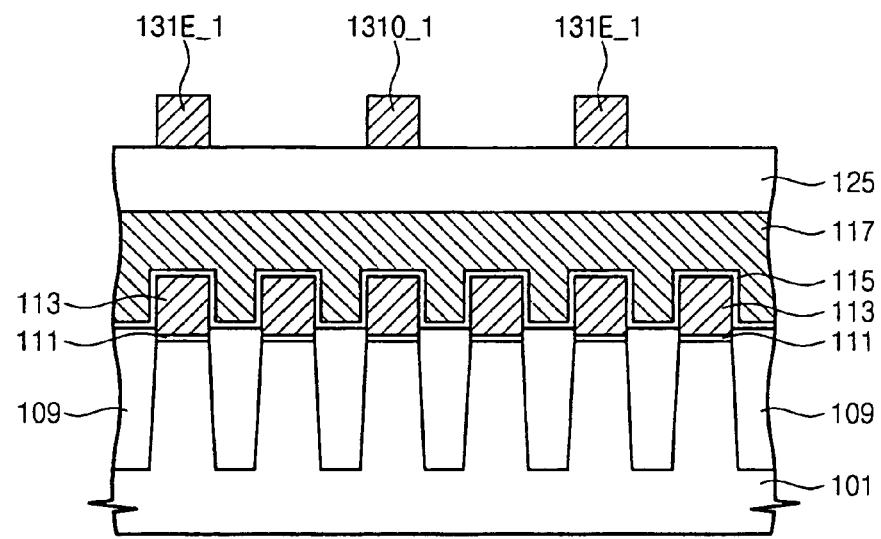
Figure 15B:
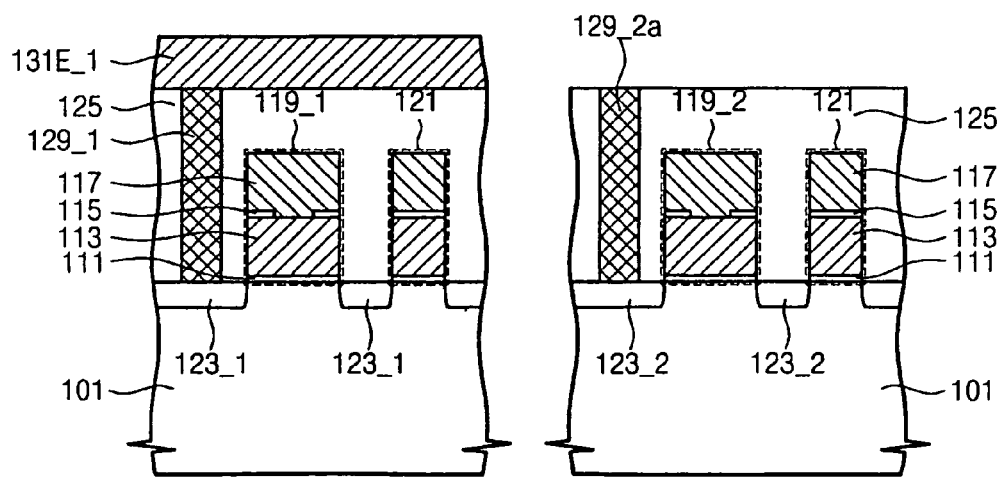

Referring to FIGS. 15A and 15B, the first contact plug 129_1 is formed in the first contact hole 127_1, and the second bottom contact plug 129_2a is formed in the second bottom contact hole 127_2a. The first contact plug 129_1 and the second bottom contact plug 129_2a may be formed by performing a planarization process after filling the first contact hole 127_1 and the second bottom contact hole 127_2a with a metal material such as a doped poly silicon and/or tungsten. Next, a metal layer is formed on the first insulation layer 125, and then patterned to form first even and odd bit lines 131E_1 and 131O_1 that are electrically connected to the first contact plug 129_1. Moreover, the first even and odd bit lines 131E_1 and 131O_1 are electrically connected to the first string select transistor by the first contact plug 129_1.

Figure 16A:
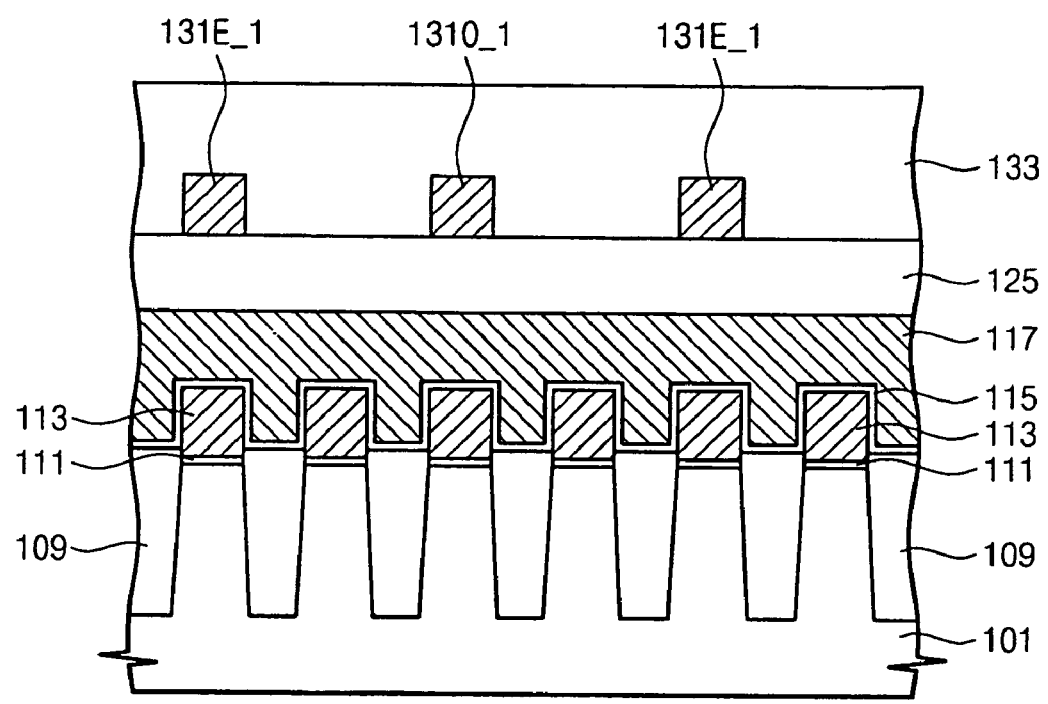
Figure 16B:
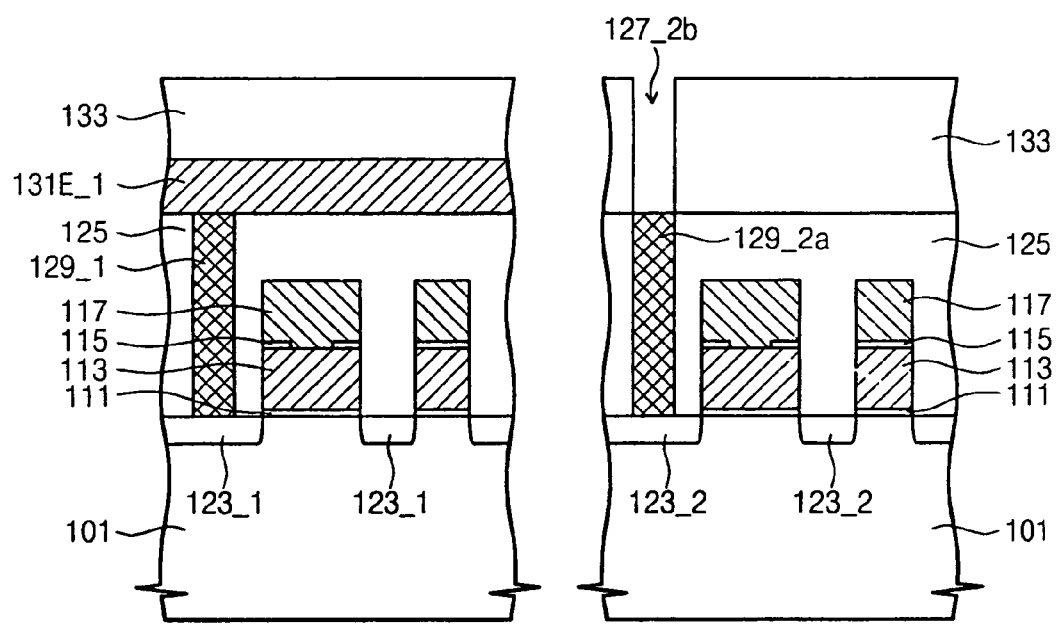

Referring to FIGS. 16A and 16B, a second insulation layer 133 is formed on the first insulation layer 125 to cover the first even and odd bit lines 131E_1 and 131O_1. A second top contact hole 127_2b exposing the second bottom contact plug 129_1a is formed by patterning the second insulation layer 133.

Figure 17A:
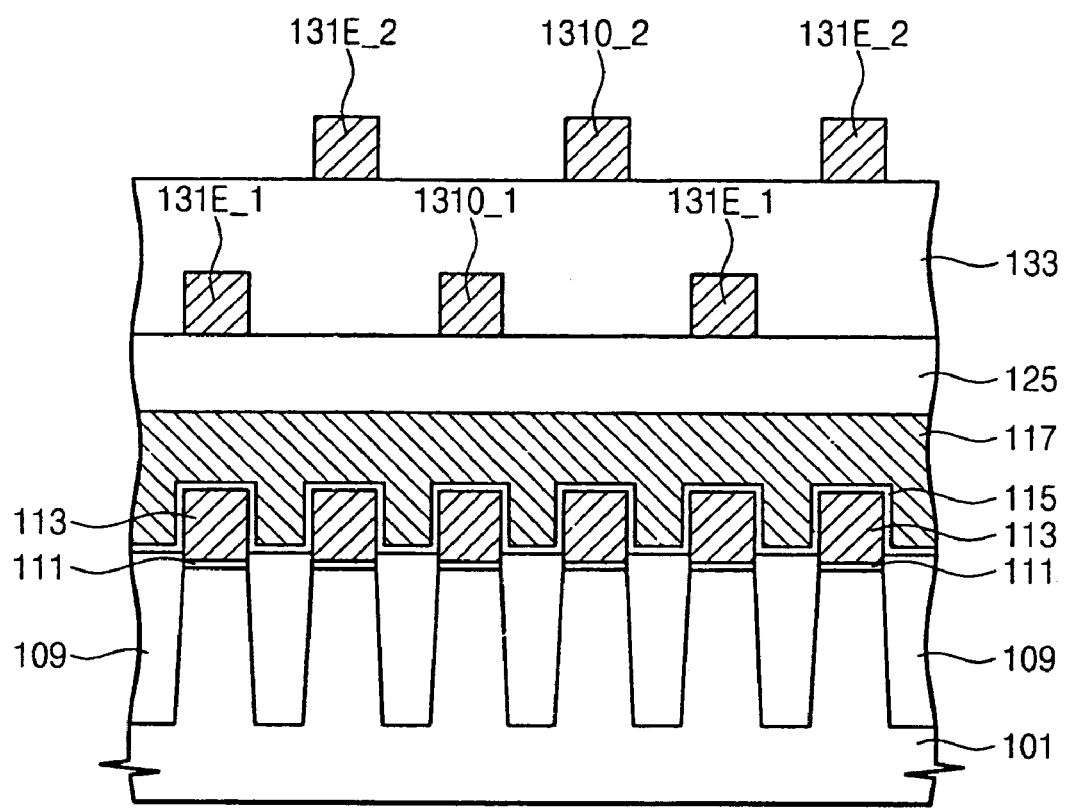
Figure 17B:
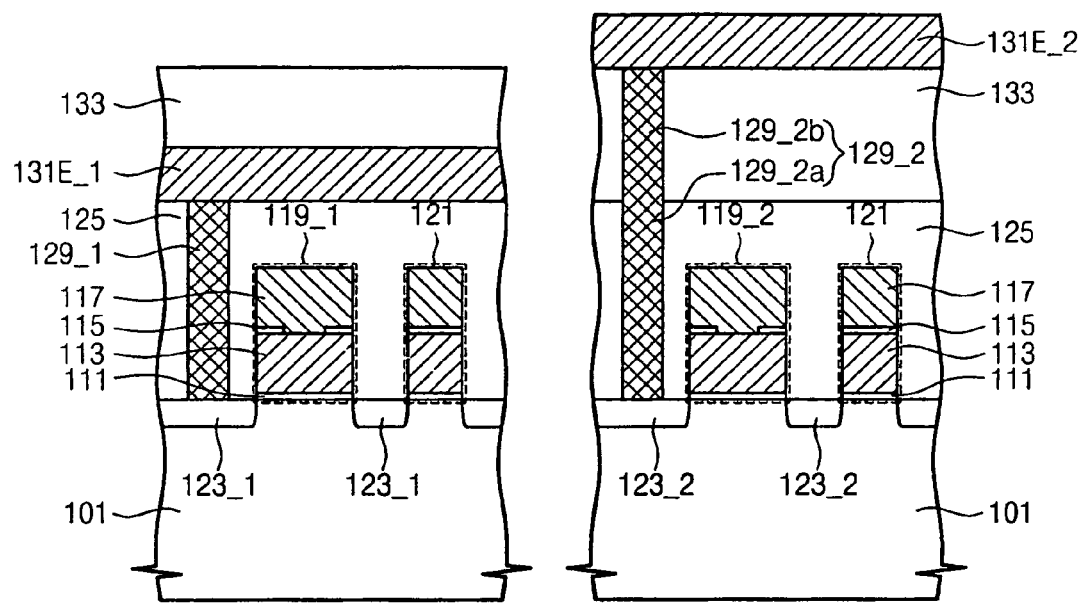

Referring to FIGS. 17A and 17B, a second top contact plug 129_2b is formed in the second top contact hole 127_2b. The second top contact plug 129_2b may be formed by performing a planarization process after filling the first contact hole with a metal material such as a doped poly silicon and/or tungsten, thereby forming a second contact plug 129_2 that is electrically connected to the second impurity region 123_2 of the second string select transistor.

Next, a metal layer on the second insulation layer 133 is formed and then patterned to form the second even and odd bit lines 131E_2 and 131O_2 that are electrically connected to the second contact plugs 129_2. Moreover, the second even and odd bit lines 131E_2 and 131O_2 are electrically connected to the second string select transistor by the second contact plug 129_2.

In the second contact plug 129_2 of the embodiment, the top and the bottom thereof are formed by using respectively different processes. Accordingly, the second contact plug 129_2 having a relatively large aspect ratio is formed.

Although various embodiments of been described above in which the bit lines are disposed at two different height, the invention is not limited thereto. Instead, is to be understood that groups of bit lines may be disposed at two or more different heights relative to one another.

As described above, when performing a programming or reading operation, any coupling disturbances may be reduced between adjacent memory cells and adjacent bit lines. Therefore, the reliability and operational characteristics of an associated semiconductor memory device may be improved.

Because threshold voltage scattering may be reduced, a margin between an off state and an on state may be increased by configuring a semiconductor memory device with a multi-level cell (MLC). Moreover, the coupling between memory cells may be maintained while an interval between a control gate and an active region may be increased, which may improve their read retention characteristics of a semiconductor memory device.

The foregoing is illustrative of the present invention and is not to be construed as limiting thereof. Although various embodiments of this invention have been described, those skilled in the art will readily appreciate that many modifications are possible in the embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method for forming a semiconductor memory device comprising:
    forming a plurality of NAND strings on a semiconductor substrate, each of the NAND strings being formed to include at least one select transistor and cell transistors serially connected to the select transistor; and
    forming a plurality of bit lines electrically connected to the select transistors,
    wherein the bit lines comprise a pair of even bit lines adjacent to each other and formed on different parallel planes having different first and second heights relative to the semiconductor substrate, and a pair of odd bit lines adjacent to each other and formed on different parallel planes having different third and fourth heights relative to the semiconductor substrate, wherein the pair of even bit lines and the pair of odd bit lines are repeated to form a pattern.

2. The method of claim 1, wherein the first and third heights are the same, and the second and fourth heights are the same.

3. The method of claim 1, wherein the select transistors comprise first select transistors and second select transistors, and
    forming the bit lines comprises:
    forming a first insulation layer covering the first and second select transistors and the cell transistors;
    forming first bit lines on the first insulation layer at the first height relative to the semiconductor substrate, wherein the first bit lines are electrically connected to the first select transistors;
    forming a second insulation layer covering the first bit lines; and forming second bit lines on the second insulation layer at the second height relative to the semiconductor substrate, wherein the second bit lines are electrically connected to the second select transistors.

4. The method of claim 3, wherein forming the first insulation layer comprises forming a first contact plug penetrating the first insulation layer and electrically connected to the first select transistor.

5. The method of claim 4, wherein forming the second insulation layer comprises forming a second contact plug penetrating the first insulation layer and the second insulation layer and electrically connected to the second select transistor.

6. The method of claim 3, wherein forming the first insulation layer comprises forming a first contact plug penetrating the first insulation layer and electrically connected to the first select transistor, and a second bottom contact plug electrically connected to the second select transistor.

7. The method of claim 6, wherein forming the second insulation layer comprises forming a second top contact plug penetrating the second insulation layer and electrically connected to the second bottom contact plug.

8. The method of claim 3, wherein the select transistors comprise a pair of first and second select transistors that repeat to form a pattern.

9. The method of claim 3, wherein the select transistors comprise a pair of first select transistors and a pair of second select transistors that repeat to form a pattern.

10. A semiconductor memory device comprising:
a plurality of NAND strings on a semiconductor substrate, each of the NAND strings including at least one select transistor and plurality of cell transistors serially connected to the select transistor;
an insulation layer that covers the select transistors and the cell transistors; and
bit lines that are in the insulation layer and electrically connected to respective ones of the select transistors,
wherein the bit lines comprise a pair of even bit lines adjacent to each other and formed on different parallel planes having different heights relative to the semiconductor substrate, and a pair of odd bit lines adjacent to each other and formed on different parallel planes, wherein the pair of even bit lines and the pair of odd bit lines repeat to form a pattern.

11. The semiconductor memory device of claim 10, wherein:
the insulation layer comprises a first insulation layer that covers the select transistors and the cell transistors, and a second insulation layer on the first insulation layer, and
some of the bit lines are on the first insulation layer and other of the bit lines are on the second insulation layer.

12. The semiconductor memory device of claim 11, wherein:
the select transistors comprise first select transistors and second select transistors, and
the bit lines comprise first bit lines on the first insulation layer and electrically connected to the first select transistors, and second bit lines on the second insulation layer and electrically connected to the second select transistors.

13. The semiconductor memory device of claim 11, wherein:
the select transistors comprise a pair of first and second select transistors; and
the pair of first and second select transistors repeat to form a pattern.

14. The semiconductor memory device of claim 11, wherein:
the select transistors comprise a pair of first select transistors and a pair of second select transistors; and
the pair of first select transistors and the pair of second select transistors repeat to form a pattern.

* * * * *